(12) United States Patent
Rockenfeller

(10) Patent No.: US 7,227,749 B2
(45) Date of Patent: Jun. 5, 2007

(54) THERMAL BUS LOAD CONTROL MANAGEMENT FOR ELECTRONIC SYSTEMS

(75) Inventor: Uwe Rockenfeller, Boulder City, NV (US)

(73) Assignee: Rocky Research, Boulder City, NV (US)

( * ) Notice: Subject to any disclaimer, the term of this patent is extended or adjusted under 35 U.S.C. 154(b) by 248 days.

(21) Appl. No.: 11/007,085

(22) Filed: Dec. 7, 2004

(65) Prior Publication Data

US 2006/0120036 A1    Jun. 8, 2006

(51) Int. Cl.
*H05K 7/20* (2006.01)

(52) U.S. Cl. .................. 361/688; 361/687; 165/80.2; 165/104.33

(58) Field of Classification Search ........ 361/687–688; 165/80.2–80.5, 104.33, 185, 276; 62/383
See application file for complete search history.

(56) References Cited

U.S. PATENT DOCUMENTS

| | | | |
|---|---|---|---|
| 4,729,424 A | 3/1988 | Mizuno et al. | |
| 5,271,239 A | 12/1993 | Rockenfeller et al. | |
| 5,348,076 A * | 9/1994 | Asakawa | 165/282 |
| 5,396,775 A | 3/1995 | Rockenfeller et al. | |
| 5,483,800 A * | 1/1996 | Schrage | 62/3.7 |
| 6,435,267 B1 | 8/2002 | Sterner | |
| 6,536,510 B2 * | 3/2003 | Khrustalev et al. | 165/104.33 |
| 6,662,865 B2 * | 12/2003 | Beitelmal et al. | 165/206 |
| 6,796,372 B2 * | 9/2004 | Bear | 165/104.21 |
| 2002/0139512 A1 * | 10/2002 | Low et al. | 165/41 |
| 2002/0157820 A1 | 10/2002 | Beitelmal et al. | |
| 2004/0095721 A1 | 5/2004 | Ellsworth, Jr. et al. | |

* cited by examiner

*Primary Examiner*—Michael Datskosky
*Assistant Examiner*—Robert J. Hoffberg
(74) *Attorney, Agent, or Firm*—Knobbe Martens Olson & Bear LLP

(57) ABSTRACT

An electronic apparatus comprising a housing having a plurality of electronic components and two or more separate heat transfer systems each thermally communicating with different one or more of said electronic components is characterized by at least one central heat transfer bus communicating with the two or more heat transfer systems, one or more switching or modulating connections between the heat transfer bus and one or more of the heat transfer systems, and one or more activating components for switching or modulating the one or more connections in response to monitored thermal load or temperature of the electronic components and/or heat transfer bus. Heat transfer between said heat transfer bus and one or more of the heat transfer systems is modulated or switched on or off by the activating components.

70 Claims, 2 Drawing Sheets

THERMAL BUS LOAD CONTROL MANAGEMENT FOR ELECTRONIC SYSTEMS

BACKGROUND OF THE INVENTION

Computers and other electronic apparatus containing heat-generating microprocessors or computer chips, as well as other heat-generating components, require cooling of those components when the system is operating. Preferred compactness of electronic systems, such as computers, sophisticated recognition systems, advanced sensing systems, aiming/targeting systems, display systems, mapping systems and the like leads to a high density of heat generating electronic components. Moreover, the high speed and efficient components used in the latest systems generate significantly more heat than used in systems of just a few years ago. For example, microprocessors as used in present office and home computers can generate over 80 watts of heat energy, more than twice the amount of heat generated by previous home computer processors. To facilitate the use of multiple high level heat generating electronic components, chip cooling and electronic board cooling techniques have been developed. Most commonly, outside air is induced into the housing with one or more fans and the airflow is used to cause convective heat transfer thereby cooling the components before the air returns to the outside of the housing. Fans require additional energy to operate, are rather bulky taking up substantial amounts of interior space, and the resulting airflow is often difficult to direct to heat specific electronic components constituting the actual heat sources, especially when cooling needs change due to variations in computing load, display load, sensing load or ambient conditions.

The reliable functioning of computer and other electronic components requires operation within certain temperatures boundaries. For example microprocessor chip temperatures frequently must be operated below 60° C. for reliability and long life. Display systems require minimum temperatures for the display to be easily visible and cannot tolerate extreme heat without losing reliability and ultimately functionality. Most of these components generate heat while they are operating, and the amount of heat generated depends on the activity level and can vary significantly. Some components can produce more than two or three times their common or low end activity heat output; some components may not operate for long time periods and require essential no cooling until they are operational. Other components, especially liquid crystal displays also require a minimum temperature for proper operation. If such systems are to be used for example in cold winter climates with ambient temperatures below freezing or even below −40° C., the start-up of the display may require heat input to facilitate a minimum operating temperature as specified by such component.

Often computers and other electronic systems are not operated continuously, 24/7, or at least not with the same intensity at the same ambient temperature conditions, but instead are used either intermittently or selectively, often for relatively short periods of time with substantial inactive periods between uses or more intensely during some periods than others. Thus, cooling of the heat-generating components may vary in required cooling capacity over time or only be required for short-term, high-power heat rejection. These conditions pose a problem in applications in which the total heat rejection and cooling capacity is limited or at least limited for certain time periods.

Presently designed heat rejection systems are often inadequate to meet the load requirements needed to satisfy increasing demands for more versatile and faster operation and more complex computational schemes and display systems. At certain times the thermal capacity of present heat rejection system is overloaded to a degree and for a time period sufficient to result in electronic component failure. Moreover, all components may not fail, but rather those components that were furthest away from their allowable operating temperature condition or one or more of those components that can not tolerate excessive operating temperatures during certain or all of its operating function. Operation in extreme ambient conditions as often encountered in military applications puts additional burden on the heat transfer as the available differential temperature to the ambient is reduced.

SUMMARY OF THE INVENTION

Computer or electronics apparatus described herein comprise a housing or casing having a plurality of electronic components to be cooled and/or heated including microprocessor and/or computer chips or one or more boards with such components mounted to such one or more boards, and two or more separate heat transfer systems comprising one or more heat exchangers in thermal communication with each component to be cooled or heated. An apparatus is characterized by one or more integrated heat transfer bus systems which link individual component heat exchangers by means of at least one switching or modulating connection between each of the one or more heat transfer busses and the two or more component heat exchangers. Switching or modulation of the connection between a heat transfer bus and the component heat exchangers is activated in response to monitored load or temperature of the heat transfer bus and one or more electronic components, or in response to a preselected temperature or local limit. In a preferred embodiment, one or more thermal storage systems may be provided and linked to a component heat exchanger by the thermal bus.

DESCRIPTION OF PREFERRED EMBODIMENTS

Figure 1:
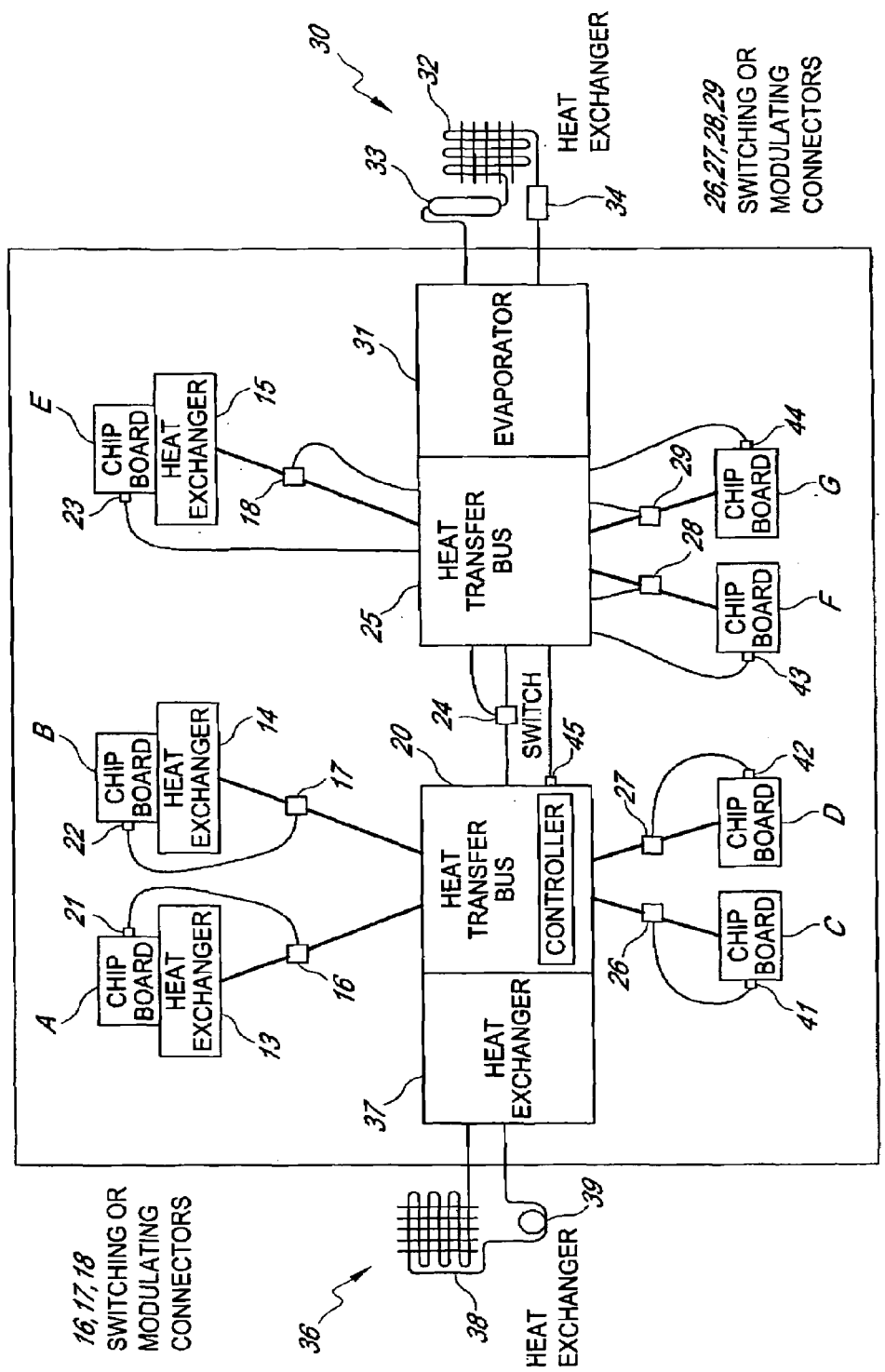
FIG. 1 schematically illustrates a computer or electronics apparatus having two central heat transfer buses and switching and modulating connections between each heat transfer bus and electronic components and heat transfer components for electronic components.

Computer or electronics apparatus described herein accomplish thermal load management, taking advantage of computer or electronic equipment thermal load variation and down time by providing a thermal bus load control and heat transfer system with switching and modulation devices facilitating the heat rejection and cooling capacities to timely meet electronic component needs. The heat transfer bus system provides means facilitating safe and reliable operation of electronic systems using a multitude of heat generating electronic components to be maintained at or below certain temperatures for their reliable and continued operation. Additional temporary and on-demand heat rejection or cooling capacity may also be provided through the discharge of thermal energy storage systems that get recharged when the time and conditions allow. The resulting system is capable of safely and reliably operating despite limited cooling or heat rejection capacity availability. Moreover, the thermal bus system allows for temporary increase, decrease or termination of cooling to any one or more components thus providing the balance of its cooling/heat rejection capacity to the remaining components. The effectiveness of such system can be enhanced by employing energy storage to accommodate thermal peak load conditions.

Capacity switching and modulating components connect the electronic components that generate the heat (the loads) with the thermal heat transfer bus. The apparatus includes sensors for detecting the need for more or less heat transfer and devices that trigger the switching or modulating components to provide more or less heat transfer. Components that have capacity to spare can switch off or modulate down, while components that require more heat transfer can switch on or modulate up. If operating temperature and/or electronic load information is available for a component, the simple measurement of such component's temperature may trigger the switching or modulation. In more complex systems, the overall thermal load on the heat transfer bus and/or the current bus temperature may also trigger the switching or modulation. The input data from one or more electronic components and the bus data may require some computing routines to determine the best modulation/switching operating mode. Computing routines can also be employed to use to determine switching and modulation based on the processing load of critical electronic components, which is often related to the amount of heat generated.

Useful thermal modulators or switches include bi-metal switches that close or open a thermal contact or comprise a series of parallel bi-metal switches for thermal contact modulation. Other useful modulators or switches comprise thermal fuses using wax or other suitable material undergoing a volumetric change as function of temperature, such volumetric change being sufficient in the operating temperature range to switch or modulate heat transfer and consequently close, open or widen a thermal contact for switching or modulation, respectively. Other useful switches include electromagnetic switches for closing contacts, such as solenoids. Series of parallel solenoids can be used for modulating in discrete steps. Heat pipes which operate to alter refrigerant charge, which in turn increases or reduces the heat transfer capacity can also be used. If such charge is reduced to below about 10% phase change heat transfer is practically turned off.

The central heat transfer bus comprises a heat transfer component configured to transfer heat. The heat transfer bus can also be provided with more or less complex technologies as needed to meet operational requirements. For example, if the electronic or computer system is used in zero and multi g-force environments, the bus may comprise a thermally conductive solid material such as copper or aluminum. Other design criteria of electrical contact and structural strength may require the use of gold, silver or titanium. For electronic or computer systems of higher thermal transport potential, a suitable heat transfer bus may include phase change heat transfer with media such as HFCs or HCFCs, water or ammonia changing phase between liquid and vapor. Another useful thermal bus uses pumped heat transfer fluids. Such fluids are preferably of higher heat capacity, such as water or fluid mixtures containing significant amounts of water, e.g. aqueous solutions of glycols, salt water brines, and alcohol-water and acetate-water solutions. Pumping can be facilitated with mechanical pumps, capillary pumps or, depending on fluids used, MHD pumps.

The load control management system can also include energy storage means. Such energy storage can be facilitated via batteries or fuel cells which power heating or cooling devices upon demand. Cooling can be directed to the central heat transfer bus or to selected individual components thereby unloading the thermal bus capacity. In cases where heating is required, the individual component selection for heating is much more likely in order to avoid the unnecessary and unintentional heating of components or complex thermal disengagement for heating of components that need cooling just seconds later. Such heat or thermal energy can also be supplied from an energy storage system. Electric energy storage for the purpose of heating can be provided by capacitors or galvanic lead-acid, nickel-cadmium, zinc-oxide lithium-ion or metal-hydride systems, hereinafter all referred to as batteries. Energy storage can also be provided by thermal energy storage systems. Convenient thermal storage systems include cold metal blocks that can absorb heat during peak load periods. Such metal blocks may have dedicated refrigeration systems, such as thermoelectric or vapor compression cooling systems cooling them, and are preferably thermally insulated. Other thermal storage media include ice (and its melting), water (and its temperature change), phase change materials such as paraffin or hydrated salts and other materials suitable to provide cooling or heating energy in the desired temperature range. Typically cooling energy is desirably released between about 20° C. and about 80° C. and preferably between about 20° C. and 60° C. whereas heating energy is desirably supplied when component temperatures as in the example for LCDs are below about −40° C. or preferably below about −10° C. However, temperature differentials to and from the electronic components to be cooled or heated and the heat exchangers absorbing or rejecting heat can vary and result in the above mentioned temperature shifting by as much as 10° C. to 20° C. Moreover, the operating temperature limits of electronic components may vary by as much as 20° C. or more on the high temperature end and 30° C. on the low temperature end.

Another means providing thermal storage for cold, hot or both is the use of coordinative complex compound sorption systems. These systems can be configured as regenerable energy storage systems for cooling, heating or both. Examples of such apparatus and processes of thermal storage and refrigeration operation are described in U.S. Pat. Nos. 5,298,231, 5,360,057, 5,441,716, 5,598,721 and 6,224,842, the descriptions of which are incorporated herein by reference in their entirety. Preferred coordinative complex compounds for this application are ammoniated and hydrated complex compounds using ammonia or water as the gaseous component, respectively. Most preferred are compounds exhibiting high energy storage densities. Preferred compounds are the systems using halide sorbent salts, specifically $SrCl_2$, $CaCl_2$, $MnCl_2$, $MgCl_2$ and $LiCl$. Ammoniated complex compounds with $SrCl_2$-$1/8NH_3$, $CaCl_2$-$2/4$ and $4/8NH_3$ and $MnCl_2$-$2/6NH_3$ are most preferred.

Another means to provide a cooling thermal buffer effect, more efficient in dry or less humid outdoor climate conditions, is by water evaporation. Materials that absorb water can be attached to a heat exchange surface or fins located outside the electronic apparatus housing providing heat rejection for the thermal bus or individual components. Sponge like materials, Celdec, silica gel, zeolites and other absorptive materials that can hold significant portions or multiples of their dry weight in water are examples. As the heat exchange surface or fins rejecting heat increase in temperature the temperature of the water laden materials will also increase thus causing the water to evaporate and provide enhanced cooling.

Heat rejection from the one or more thermal buses and/or any individual component heat exchanger and/or the apparatus interior space can be facilitated by heat exchange outside the electronic apparatus housing enclosure or inside the enclosure. If the enclosure constitutes a sealed system which is air tight and water tight, through the wall connections to outside heat exchangers or through the wall heat exchangers are preferred. Heat exchangers can be water cooled or refrigerated with refrigeration devices, such as thermoelectric coolers, vapor compression coolers or complex compound sorption systems. The outside housing walls may also be provided with fins or other surface components suitable for improved heat transfer. Such heat transfer may be forced convection by use of one or more fans or blowers or by natural convection. Water or other fluid evaporation may also be used to enhance heat transfer capacity.

Heat rejection can also be facilitated inside the housing enclosure, especially if airflow is used that communicates with the outside such that air enters and leaves the housing and exchanges heat with the heat rejecting heat exchangers of the one or more thermal buses and/or selected electronic components. If a sealed enclosure is used, convective air or gas flow can be employed to transfer heat from one or more heat exchangers rejecting heat from the one or more heat transfer buses to a through the wall heat transfer device. Individual component/chip coolers and/or heat exchangers providing cooling in the apparatus interior may be active or passive. Active coolers include thermoelectric devices and refrigerant containing heat exchangers, especially those having through the wall heat rejection capability. Passive cooling components include thermosyphons, heat pipes, solid thermal conductors or combinations of two or more of such devices. Thus, fans, coolers and/or heat exchangers may be used in parallel with the one or more thermal buses to provide cooling directly to the electronic components, in either open or sealed housing systems.

The electronic apparatus illustrated in FIG. 1 comprises a housing 10, the walls of which define an interior chamber containing the electronic or computer components. In the embodiment illustrated, the housing is shown as a sealed or enclosed wall structure whereby no outside air or gas enters the housing interior, such a housing being used where sealing of the components from the environment is important, for example, where the electronic components are to be isolated from environmental conditions including water, mud, dust, etc. Chip boards A–G are illustrated on which computer chips, transistors, or other heat-generating electronic components such as power supply, graphics card, hard disk, processors, etc. are mounted. The placement of the boards shown aligned along opposite interior housing walls is not particularly critical. Boards A, B and E are provided with heat exchangers 13, 14 and 15, respectively. These heat exchangers operatively communicate with a heat transfer bus via separate heat transfer communication conduits, pipes or other operative communication. On the other side of the interior chamber are chip boards C, D, F and G which are also connected in heat exchange communication with a thermal bus. Two such central heat transfer buses 20 and 25 are shown, bus 20 operatively connected to boards E, F and G and bus 25 operatively connected to boards A, B, C and D. Switching or modulating connections are provided by connectors 16–18 and 26–29. These modulating connectors, as previously described, are positioned along the operative heat transfer conduits, pipes or other heat transfer component capable of directing heat transfer between a bus and a component heat exchanger, board heat exchanger or heat transfer surface or other device capable of transferring heat to and from the heat generating component. Activating components for switching or modulating the connections include temperature sensors which monitor the temperature of the individual chip boards or electronic components. Temperature sensors 21–23 are positioned for monitoring temperatures of boards A, B and E, respectively, and temperature monitoring sensors 41–44 are positioned for monitoring the temperatures of the heat generating components C, D, F and G, respectively. Central heat transfer bus 25 is operatively connected to cool or exchange heat with components A, B, C and D while central heat transfer bus 20 is operatively connected for heat transfer with components E, F and G. Temperature sensors 21 and 22 are operatively connected to switching connectors 16 and 17, respectively, and temperature sensors 41 and 42 are operatively connected to switching or modulating connectors 26 and 27, respectively. Thus, central heat transfer bus operates to provide heat transfer via the switching or modulating connections in response to monitored temperature of a component provided to a modulating or switching connector.

Heat transfer between central heat transfer bus 20 and components E, F and G is carried out in response to temperature of the components sensed by temperature sensors and communicated to the central heat transfer bus. Heat transfer bus 20 includes a controller which is configured to direct switching and modulating of the connectors including instructions for directing such switching or modulating in response to the monitored temperatures of the electronic components. As previously discussed, such a controller may have instructions for carrying out the switching or modulating in response to temperature of the heat transfer bus, or the controller may also include instructions for directing switching or modulation in response to anticipated thermal load of the heat transfer bus or of the components themselves. The system shown also includes a temperature sensor 45 on heat transfer bus 25 which monitored temperature is communicated to heat transfer bus 20 which is operatively connected to a switching device 24. Thus cooling or other heat transfer from bus 20 to meet the demands or requirements of bus 25 is provided.

Cooling or heat exchange is provided to heat transfer bus 20 via a heat exchanger 30 which includes evaporator 31 thermally communicating with bus 20 and the heat exchanger including through-the-wall pipes for directing a phase change refrigerant in a heat exchange loop which includes complex compound reactor 33, condenser 32 and refrigerant reservoir 34. Cooling is supplied to heat transfer bus 25 by through-the-wall conduits to heat exchanger 37 utilizing a pumped heat transfer liquid loop. The external heat exchange apparatus 36 includes heat exchanger 38 and heat transfer fluid pump 39.

Figure 2:
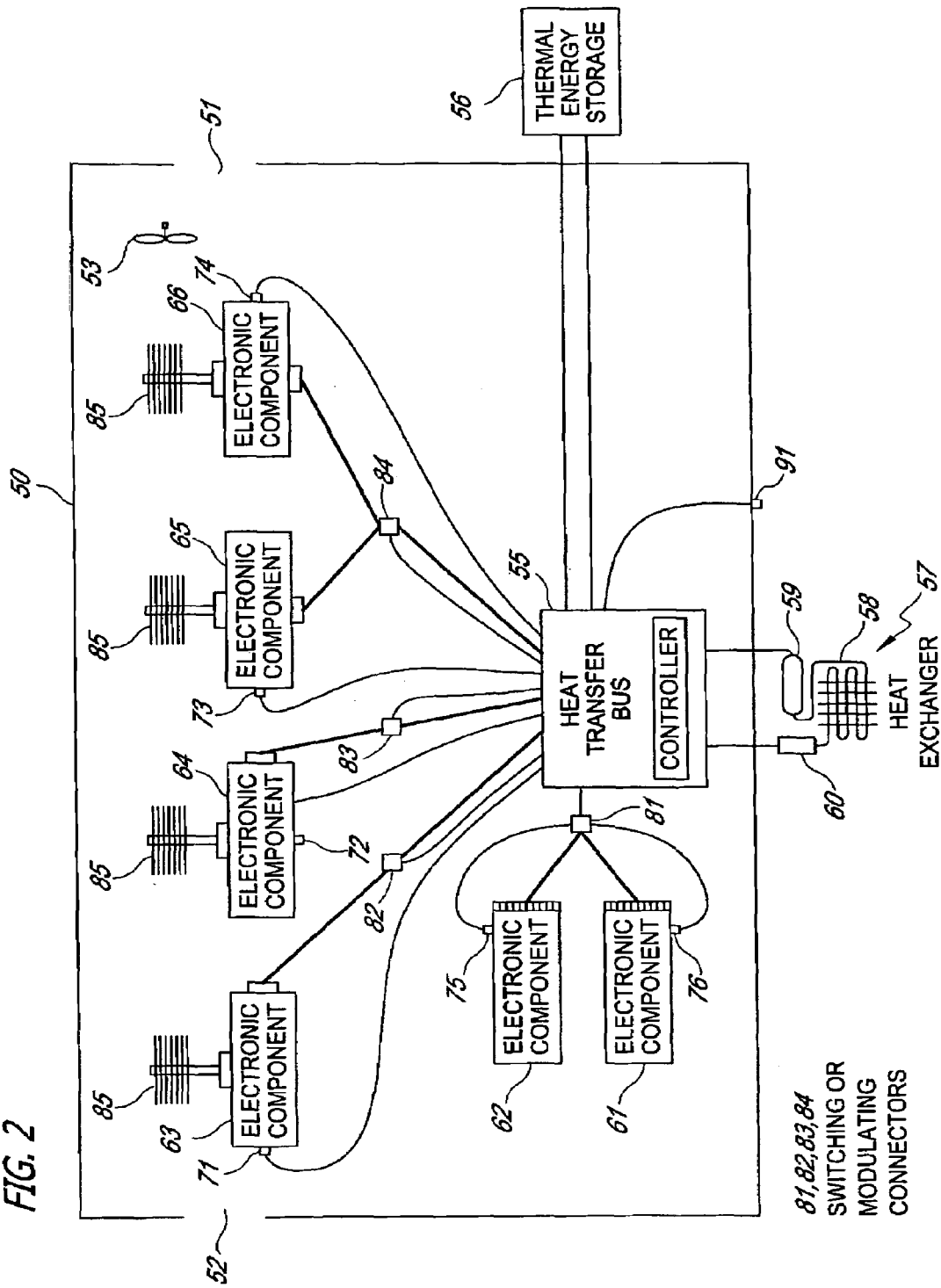
FIG. 2 is a schematic illustration of another embodiment of the apparatus described herein having a central heat transfer bus, switching or modulating connections, temperature sensors and connections between the components.

The apparatus illustrated in the embodiment of FIG. 2 includes a housing 50 which is provided with an inlet port or vent 51 and an outlet port 52. A fan 53 provides a flow of air through the interior between the ports 51 and 52. A plurality of heat generating electronic components 63–66 are positioned with component heat exchangers 85 located along the air flow passageway between the inlet and outlet ports to provide cooling for the electronic components. In the embodiment illustrated, central heat transfer bus 55 is operatively connected to the components 63–66 for heat exchange between the bus and the components via modulating and switching connectors 82, 83 and 84. Switching connector 84 thermally communicates the bus with both electronic components 65 and 66 whereas individual modulating connectors 82 and 83 thermally connect bus 55 with components 63 and 64, respectively. Temperature monitors 71–74 monitor the temperatures of components 63–66, and communicate with bus 55. Heat transfer bus 55 includes a controller having instructions for directing switching or modulating to the connectors 82, 83 and 84 in response to the electronic component temperatures sensed by the temperature sensors and communicated to the bus. The temperatures of electronic components 61 and 62 are monitored by heat sensors 75 and 76, respectively, which temperatures are communicated to switching connector 81 to provide heat exchange from the bus to the components to meet the heat transfer needs of the components. A temperature 91 monitors ambient or outside temperature is connected to heat transfer bus 55. The controller may also include instructions for switching or modulating heat transfer and for prioritizing heat transfer to the various electronic components in response to component temperatures and/or ambient temperatures. The heat transfer bus 55 includes an evaporator (not shown) as a component of external heat exchanger 57 which includes a phase change refrigerant loop comprised of compressor 59, condenser 58 and reservoir 60. A thermal energy storage apparatus 56 configured to supply cooling or heating as required to heat transfer bus 55 is also illustrated. The apparatus may also be provided with one or more heat exchange components positioned along the air flow path for cooling the air which cools the electronic components. Such heat exchange components may be active or passive heat sinks or heat exchangers including through-the-wall systems for rejecting heat to the exterior of the housing.

The above embodiments illustrated in FIGS. 1 and 2 describe the use of one or more central thermal buses for thermal management of an electronic or computer system containing components which generate heat that must be dissipated and rejected from the apparatus to prevent component overheating and malfunction or inefficiency, or where needed, to provide heat so that a component operates in the intended and necessary temperature ranges. The one or more central heat transfer bus or buses used may comprise an apparatus configured to direct heat transfer to and from the components, and include as part of the bus or cooperating with the bus suitable heat exchange apparatus as previously described. Heat exchange directed by the thermal bus is transferred through a switching or modulating connection from the bus to a heat transfer device or system responsible or capable of transferring heat exchange of the electronic component. As shown in the drawings and described, the thermal bus may also comprise a controller which cooperates with one or more temperature sensors which monitor the temperature of the electronic component and, if so designed, the heat transfer bus itself. As also described, the switching or modulating connections between the heat transfer bus and the one or more heat transfer systems for the components may be activated by a signal or instructions from the heat transfer bus, or from a signal from the temperature sensor directly to the switching or modulating component. As also illustrated and described, a thermal bus need not be the exclusive means for cooling electronic components in an apparatus, but may be used in parallel with other means and heat exchangers which also provide cooling to the system and/or individual components. Such operations and variations and combinations thereof will be evident to those skilled in the art.

What is claimed is:

1. An electronic apparatus comprising a housing having a plurality of electronic components therein, two or more separate heat transfer systems each thermally communicating with different one or more of said electronic components, said heat transfer systems comprising one or more heat exchangers for transferring thermal energy to and/or from said electronic components, and at least one central heat transfer bus communicating with said two or more heat transfer systems, said apparatus characterized by:

one or more switching or modulating connections between said heat transfer bus and one or more of said heat transfer systems, and one or more activating components for switching or modulating said one or more connections in response to monitored thermal load or temperatures of said one or more of said electronic components and/or said heat transfer bus, or in response to a preselected temperature or thermal load of said heat transfer bus and/or one or more of said electronic components, whereby heat transfer between said heat transfer bus and one or more of said heat transfer systems is modulated or switched on or off by said activating components.

2. An apparatus of claim 1 wherein said one or more activating components comprises one or more sensors for monitoring the temperature or load of said heat transfer bus and/or one or more of said electronic components, said one or more sensors operatively communicating with said switching or modulating connections, and/or one or more sensors for monitoring the temperature or load of one or more of said electronics components and operatively communicating with said switching or modulating connection.

3. An apparatus of claim 2 wherein said heat transfer bus comprises a heat exchanger including a heat transfer medium and wherein one or more of said sensors for monitoring the temperature or load of said heat transfer bus monitors the temperature of said heat transfer medium and/or measures the ambient temperature.

4. An apparatus of claim 2 comprising a controller configured to direct switching and modulating of the said one or more connections.

5. An apparatus of claim 4 wherein said controller comprises instructions for directing switching or modulating one or more of said connections in response to monitored temperatures of said heat transfer bus and one or more of said electronic components.

6. An apparatus of claim 4 wherein said controller comprises instructions for directing switching or modulating one or more of said connections in response to monitored load of one or more of said electronic components.

7. An apparatus of claim 4 wherein said controller comprises instructions for directing switching or modulating one or more of said connections in response to monitored temperature and monitored or computed load of said heat transfer bus and/or one or more of said electronic components.

8. A heat transfer apparatus of claim 4 wherein said controller comprises instructions for directing switching or modulation in response to monitored or anticipated thermal load of said heat transfer bus.

9. An apparatus of claim 4 wherein said controller comprises instructions for switching or modulating a connection to at least one of said electronic components in response to operating temperature or operational load limitations of said electronic components.

10. An apparatus of claim 9 wherein said controller comprises instructions for prioritizing heat transfer requirement in response to sensed electronic component temperature an/or thermal load.

11. An apparatus claim 10 wherein said controller comprises instructions for said prioritizing in response to two or more sensed conditions selected from ambient temperature, component temperature, component loads, anticipated temperatures and anticipated loads.

12. An apparatus of claim 4 wherein said controller comprises instructions for directing switching or modulation in response to prioritized heat transfer requirement of one or more selected of said electronic components.

13. An apparatus of claim 1 wherein said heat transfer bus includes a phase change refrigerant heat exchange loop.

14. An apparatus of claim 13 wherein said phase change refrigerant is a hydrofluorocarbon.

15. An apparatus of claim 1 wherein said heat transfer bus comprises a pumped liquid loop.

16. An apparatus of claim 15 wherein said pumped liquid comprises water.

17. An apparatus of claim 1 wherein said heat transfer bus comprises a thermally conductive solid material.

18. An apparatus of claim 17 wherein said conductive solid material comprises a metal selected from the group consisting of copper, aluminum, titanium and gold.

19. An apparatus of claim 1 wherein at least one of said modulating connections comprises a heat transfer capacity modulator.

20. An apparatus of claim 19 wherein said capacity modulator comprises a heat pipe.

21. An apparatus of claim 20 wherein said heat pipe is configured to modulate its capacity by refrigerant charge alteration.

22. An apparatus of claim 19 wherein said capacity modulator comprises a thermally expandable composition configured to increase the cross-section of the effective heat transfer path.

23. An apparatus of claim 1 wherein at least one of said switching connections comprises a heat transfer switching device.

24. An apparatus of claim 23 wherein said heat transfer switching device comprises a thermally sensitive bi-metal.

25. An apparatus of claim 23 wherein said heat transfer switching device comprises a heat pipe which substantially eliminates its heat transfer by reducing its refrigerant charge to less than 10% of the design charge.

26. An apparatus of claim 23 wherein said heat transfer switching device comprises a thermal fuse.

27. An apparatus of claim 26 wherein said thermal fuse comprises wax.

28. An apparatus of claim 1 wherein said activating component comprises an electrically actuated contact.

29. An apparatus of claim 28 wherein said electrically actuated contact comprises one or more solenoid switches providing thermal conductance through metal contact when closed.

30. An apparatus of claim 1 wherein said activating component comprises a plurality of individually controlled electrically actuated contacts for modulating said one or more connections.

31. An apparatus of claim 30 wherein said plurality of electrically actuated contacts comprise solenoid switches configured to provide thermal conductance through metal contact when closed.

32. An apparatus of claim 1 wherein at least one of said heat transfer systems comprises means for heating.

33. An apparatus claim 1 including one or more heat sinks exterior to the housing and wherein said central heat transfer bus is thermally connected to said one or more heat sinks.

34. An apparatus of claim 33 wherein said one or more heat sinks comprises forced convection heat transfer apparatus.

35. An apparatus claim 33 wherein said one or more heat sinks comprises an active refrigeration cooling component comprising a thermoelectric device, liquid cooled heat exchanger, or refrigerant evaporator.

36. An apparatus claim 33 or 35 wherein said heat sink comprises a heat transfer fluid loop.

37. An apparatus claim 33 wherein said heat sink comprises a coordinative complex compound refrigeration apparatus.

38. An apparatus claim 1 wherein said central heat transfer bus includes a heat exchanger and wherein said apparatus includes one or more fans for directing a flow of air in heat exchange communication with said heat transfer bus heat exchanger.

39. An apparatus claim 38 wherein said housing includes one or more ports cooperating with said one or more fans for directing air flow into and out of said housing.

40. An apparatus claim 1 including an active cooling or refrigeration system in thermal communication with said central heat transfer bus.

41. An apparatus claim 40 wherein said active cooling or refrigeration system includes one or more heat exchangers in direct thermal communication with said central heat transfer bus.

42. An apparatus claim 40 comprising a heat exchanger having a heat transfer fluid comprising a liquid, gas or two phase heat transfer fluid in direct thermal communication between said central heat transfer bus and said active cooling or refrigeration system.

43. An apparatus claim 42 wherein said heat transfer fluid is a vaporizable refrigerant.

44. An apparatus of claim 42 wherein said heat transfer fluid comprises water or an aqueous fluid.

45. An apparatus claim 40 wherein said active cooling or refrigerating system comprises a heat exchanger outside said housing and having a heat exchange surface for evaporating water for cooling thereof.

46. An apparatus claim 40 wherein said active cooling or refrigeration system comprises water evaporation.

47. A heat transfer apparatus for removing heat from an electronic apparatus comprising a housing having a plurality of electronic components therein, said heat transfer apparatus comprising:

one or more separate heat transfer systems each thermally communicating with a different one or more of said electronic components, said one or more heat transfer systems comprising one or more heat exchangers for transferring thermal energy to and/or from said electronic components, and a central heat transfer bus communicating with said one or more heat transfer systems, one or more switching or modulating connections between said heat transfer bus and one or more of said heat transfer systems, and activating means for switching or modulating said one or more connections in response to monitored thermal load or temperature of said one or more electronic components and/or said heat transfer bus, or in response to a preselected temperature or thermal load of said one or more electronic components and/or said heat transfer bus, whereby heat transfer between said heat transfer bus and one or more of said heat transfer systems is modulated or switched on or off by said activating means.

48. A heat transfer apparatus of claim 47 wherein at least one thermal load is not in thermal communication with the one or more heat transfer systems for the central heat transfer bus.

49. A heat transfer apparatus of claim 47 wherein one or more but less than all of said heat transfer systems comprise a heat exchange external to said housing.

50. A heat transfer apparatus of claim 47 including one or more direct heat exchangers for transferring heat directly from an electronic component to the exterior of said housing independent of said heat transfer bus and wherein said one or more direct heat exchangers are not in thermal communication with said heat transfer bus.

51. A heat transfer apparatus of claim 47 including means for heating at least one of said electronic components.

52. A heat transfer apparatus of claim 47 including an energy storage system for selectively discharging energy to said one or more heat transfer systems and/or said central heat transfer bus.

53. A heat transfer apparatus of claim 52 wherein said energy storage system is a thermal energy storage system and comprises a metal block.

54. A heat transfer apparatus of claim 52 wherein said energy storage system comprises a battery to operate a cooling or heating energy flow.

55. A heat transfer apparatus of claim 52 wherein said energy storage system is configured to release heat to an electronic component.

56. A heat transfer apparatus of claim 47 including a thermal energy storage system in thermal communication with said central heat transfer bus for selectively discharging thermal energy commonly for cooling thereto.

57. A heat transfer apparatus of claim 56 wherein said thermal energy storage system comprises ice or water.

58. A heat transfer apparatus of claim 56 wherein said thermal energy storage system comprises a coordinative complex compound sorption system.

59. A heat transfer apparatus of claim 56 wherein said thermal energy storage system comprises a phase change material undergoing phase change from solid to liquid in the operating temperature range of the heat transfer system.

60. A heat transfer apparatus of claim 56 wherein said thermal energy storage system comprises a vaporizable liquid.

61. A heat transfer apparatus of claim 60 wherein said liquid is water.

62. A heat transfer apparatus of claim 60 liquid is a refrigerant.

63. A heat transfer apparatus of claim 62 wherein vaporized refrigerant is absorbed on an absorbent.

64. A heat transfer apparatus of claim 56 wherein said thermal energy storage system is configured to release heat to an electronic component.

65. A heat transfer apparatus of claim 64 wherein said thermal energy storage system is configured to release heat independent of said heat transfer bus.

66. A heat transfer apparatus of claim 64 wherein said electronic component is configured to selectively receive cooling independent of said heat transfer bus.

67. A method of operating an apparatus of claim 1 comprising sensing electronic component temperature and switching or modulating said components in response to electronic component temperature.

68. A method of operating an apparatus of claim 67 comprising switching or modulating in response to two or more of the following: one or more of the electronic component or component heat transfer system temperatures and/or the thermal bus temperature and/or the ambient temperature.

69. A method of operating an apparatus of claim 1 comprising sensing the temperature of at least one of said electronic components and activating said activation means in response thereto.

70. A method of operating an apparatus of claim 1 comprising sensing the temperature of the thermal bus and/or the ambient temperature and use of the predicted or calculated load of one or more electronic components.

* * * * *

UNITED STATES PATENT AND TRADEMARK OFFICE
CERTIFICATE OF CORRECTION

PATENT NO. : 7,227,749 B2  Page 1 of 1
APPLICATION NO. : 11/007085
DATED : June 5, 2007
INVENTOR(S) : Uwe Rockenfeller It is certified that error appears in the above-identified patent and that said Letters Patent is hereby corrected as shown below:

On The Title Page, (Primary Examiner), delete "Datskosky" and insert -- Datskovskiy --, therefor.

At column 9, line 4, in Claim 10, delete "an/or" and insert -- and/or --, therefor.

At column 10 (Examiner's Amendement), line 41, in Claim 45, delete "refrigerating" and insert -- refrigeration --, therefor.

Signed and Sealed this

Twentieth Day of November, 2007

JON W. DUDAS
*Director of the United States Patent and Trademark Office*